(12) United States Patent
Kim et al.

(10) Patent No.: US 11,586,330 B2
(45) Date of Patent: Feb. 21, 2023

(54) TOUCH SENSING MODULE AND ELECTRONIC DEVICE

(71) Applicant: Samsung Electro-Mechanics Co., Ltd., Suwon-si (KR)

(72) Inventors: Jong Yun Kim, Suwon-si (KR); Gye Won Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 72 days.

(21) Appl. No.: 17/142,651

(22) Filed: Jan. 6, 2021

(65) Prior Publication Data

US 2022/0137750 A1 May 5, 2022

(30) Foreign Application Priority Data

Oct. 29, 2020 (KR) .................. 10-2020-0141906

(51) Int. Cl.
*G06F 3/044* (2006.01)
*H03K 17/96* (2006.01)

(52) U.S. Cl.
CPC ......... *G06F 3/0445* (2019.05); *H03K 17/962* (2013.01); *G06F 2203/04105* (2013.01); *H03K 2217/960735* (2013.01)

(58) Field of Classification Search
CPC ............... G06F 3/0414; G06F 3/04142; G06F 3/04144; G06F 3/04146; G06F 2203/04105; G06F 2203/04106
See application file for complete search history.

(56) References Cited

U.S. PATENT DOCUMENTS

| 2015/0035793 A1* | 2/2015 | Hirotsune ........... G06F 3/03545 345/174 |
| 2018/0093695 A1* | 4/2018 | Hattori .................... B62D 1/046 |
| 2021/0089187 A1* | 3/2021 | Hong ...................... G06F 3/046 |

FOREIGN PATENT DOCUMENTS

| KR | 10-1875368 B1 | 8/2018 |
| KR | 10-2149385 B1 | 8/2020 |

\* cited by examiner

*Primary Examiner* — Alexander Eisen
*Assistant Examiner* — Nathaniel P Brittingham
(74) *Attorney, Agent, or Firm* — NSIP Law (57) ABSTRACT

A touch sensing module includes: a first sensing coil and a second sensing coil, each having inductance varying in response to an applied force touch; a first pad having capacitance varying in response to an applied contact touch, disposed closer to the second sensing coil than to the first sensing coil, and electrically connected to the first sensing coil to constitute a first resonance circuit; and a second pad having capacitance varying in response to the applied contact touch, disposed closer to the first sensing coil than to the second sensing coil, and electrically connected to the second sensing coil to constitute a second resonance circuit.

20 Claims, 7 Drawing Sheets

TOUCH SENSING MODULE AND ELECTRONIC DEVICE

CROSS-REFERENCE TO RELATED APPLICATIONS

This application claims the benefit under 35 U.S.C. § 119(a) of Korean Patent Application No. 10-2020-0141906 filed on Oct. 29, 2020 in the Korean Intellectual Property Office, the entire disclosure of which is incorporated herein by reference for all purposes.

BACKGROUND

1. Field

The following description relates to a touch sensing module and an electronic device including a touch sensing module.

2. Description of Related Art

In general, it is desirable that a wearable device be thin and have a simple, clean design. To achieve such attributes, existing mechanical switches in wearable devices may be replaced with non-mechanical switches implemented using dustproofing and waterproofing technologies, enabling the production of wearable devices having seamless housings.

Current technologies such as touch-on-metal (ToM) technology implementing touches on a metal surface, a capacitance sensing method using a touch panel, a microelectromechanical system (MEMS), a micro strain gauge, and other technologies have been developed. In addition, a force touch function is under development.

In the case of an existing mechanical switch, in addition to other problems, a large size and a large amount of internal space may be required to implement a switching function, and a design may be somewhat untidy and a large amount of space may be required due to an outwardly protruding shape of the switch, which has a structure that may not be integrated with an external case.

In addition, there may be a risk of an electric shock due to direct contact with an electrically connected mechanical switch. Moreover, a structure of the mechanical switch may make it difficult to implement dustproofing and waterproofing.

The above information is presented as background information only, to assist in an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a touch sensing module includes: a first sensing coil and a second sensing coil, each having inductance varying in response to an applied force touch; a first pad having capacitance varying in response to an applied contact touch, disposed closer to the second sensing coil than to the first sensing coil, and electrically connected to the first sensing coil to constitute a first resonance circuit; and a second pad having capacitance varying in response to the applied contact touch, disposed closer to the first sensing coil than to the second sensing coil, and electrically connected to the second sensing coil to constitute a second resonance circuit.

The first resonance circuit may be configured to generate a first resonance signal having a first resonant frequency varying in response to an applied touch including either one or both of the applied force touch and the applied contact touch. The second resonance circuit may be configured to generate a second resonance signal having a second resonant frequency varying in response to the applied touch including either one or both of the applied force touch and the applied contact touch.

The touch sensing module may further include a detection circuit electrically connected to the first and second resonance circuits and configured to determine a touch application position based on a change in the first resonant frequency and a change in the second resonant frequency.

The detection circuit may be further configured to: compare an amount of the change in the first resonant frequency with an amount of the change in the second resonant frequency; determine that the applied touch is applied to the first resonance circuit, in response to the change in the first resonant frequency being greater than the change in the second resonant frequency; and determine that the applied touch is applied to the second resonance circuit, in response to the change in the second resonant frequency being greater than the change in the first resonant frequency.

The first resonance circuit may be further configured to generate the first resonance signal based on a result of summing a change in the first resonant frequency depending on a change in the inductance of the first sensing coil and a change in the first resonant frequency depending on a change in the capacitance of the first pad. The second resonance circuit may be further configured to generate the second resonance signal based on a result of summing a change in the second resonant frequency depending on a change in the inductance of the second sensing coil and a change in the second resonant frequency depending on a change in the capacitance of the second pad.

The first and second sensing coils may be spaced apart from each other. The second pad and the first pad may be symmetrically disposed outside the first sensing coil and the second sensing coil, respectively.

The touch sensing module may further include: a third sensing coil having inductance varying in response to the applied force touch, the third sensing coil being spaced apart from the second sensing coil to be symmetrical with respect to the first sensing coil about the second sensing coil; a third pad having capacitance varying in response to the applied contact touch, the third pad being disposed closer to the second sensing coil than to the first and third sensing coils, and being electrically connected to the third sensing coil to constitute a third resonance circuit; and an additional second pad having capacitance varying in response to the applied contact touch, the additional second pad being disposed closer to the third sensing coil than to the first and second sensing coils, and being electrically connected to the second sensing coil.

The touch sensing module may further include at least one sensing coil disposed between the first and second sensing coils.

In another general aspect, an electronic device includes: a touch switch unit disposed on a housing; and a touch sensing module configured to sense a touch input applied to the touch switch unit. The touch switch unit includes a first touch member and a second touch member. The touch sensing module includes: a first sensing coil and a second sensing coil, each having inductance varying in response to an applied force touch, the first sensing coil and the second sensing coil being respectively disposed on an inner-side portion spaced apart from the first touch member and an inner-side portion spaced apart from the second touch member; a first pad having capacitance varying in response to an applied contact touch, the first pad being disposed on the inner-side portion spaced apart from the second touch member, and the first pad being electrically connected to the first sensing coil to constitute a first resonance circuit; and a second pad having capacitance varying in response to the applied contact touch, the second pad being disposed on the inner-side portion spaced apart from the first touch member, and the second pad being electrically connected to the second sensing coil to constitute a second resonance circuit.

The first sensing coil and the first pad may be configured to generate a first resonance signal having a first resonant frequency varying in response to an applied touch including either one or both of the applied force touch and the applied contact touch being applied to the touch switch unit. The second sensing coil and the second pad may be configured to generate a second resonance signal having a second resonant frequency varying in response to the applied touch including either one or both of the applied force touch and the applied contact touch being applied to the touch switch unit.

The touch sensing module may be configured to determine a touch application position in the touch switch unit, based on a change in the first resonant frequency and a change in the second resonant frequency.

The first resonance signal may be generated based on a result of summing a change in the first resonant frequency depending on a change in the inductance of the first sensing coil and a change in the first resonant frequency depending on a change in the capacitance of the first pad. The second resonance signal may be generated based on a result of summing a change in the second resonant frequency depending on a change in the inductance of the second sensing coil and a change in the second resonant frequency depending on a change in the capacitance of the second pad.

An amount of the change in the first resonant frequency an amount of the change in the second resonant frequency may be compared with each other to determine that the applied force touch is applied to the first touch member, in response to the amount of the change in the first resonant frequency being is greater than the amount of the change in the second resonant frequency, and to determine that the applied force touch is applied to the second touch member, in response to the amount of the change in the second resonant frequency being greater than the amount of the change in the first resonant frequency.

The first and second sensing coils may be spaced apart from each other. The second pad and the first pad may be symmetrically disposed outside the first sensing coil and the second sensing coil, respectively.

The touch switch unit may further include a third touch member. The touch sensing module may further include: a third sensing coil having inductance varying in response to the applied force touch, the third sensing coil being disposed on an inner-side portion spaced apart from the third touch member; a third pad having capacitance varying in response to the applied contact touch, the third pad being disposed on the inner-side portion spaced apart from the second touch member, and the third pad being electrically connected to the third sensing coil to constitute a third resonance circuit; and an additional second pad having capacitance varying in response to the applied contact touch, the additional second pad being disposed on the inner-side portion spaced apart from the third touch member, and being electrically connected to the second sensing coil.

The first sensing coil and the second pad may be disposed in positions facing the first touch member. The third sensing coil and the additional second pad may be disposed in positions facing the third touch member. The second sensing coil, the first pad, and the third pad may be disposed in positions facing the second touch member.

The electronic device may further include at least one sensing coil disposed between the first and second sensing coils.

The first sensing coil and the second pad may be disposed in positions facing the first touch member. The second sensing coil and the first pad may be disposed in positions facing the second touch member.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depictions of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed, as will be apparent after gaining an understanding of this disclosure, with the exception of operations necessarily occurring in a certain order. Also, descriptions of features known in the art may be omitted for increased clarity and conciseness.

The features described herein may be embodied in different forms, and are not to be construed as being limited to the examples described herein. Rather, the examples described herein have merely been provided to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

Figure 1:
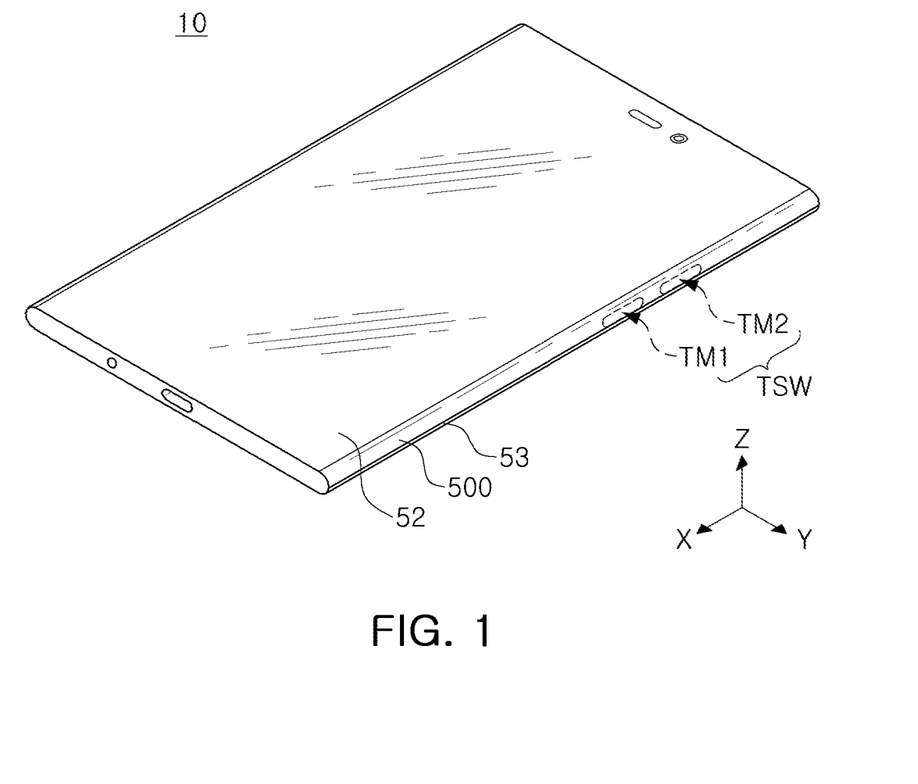
FIG. 1 is a perspective view illustrating an exterior of an electronic device, according to an example.

FIG. 1 is a perspective view illustrating an exterior of an electronic device 10, according to an example.

Referring to FIG. 1, the electronic device 10 may include, for example, a front display glass 52, a rear glass 53, and a housing 500.

The front display glass 52 may be disposed on one surface of an electronic device 10, and the rear glass 53 may be disposed on the other (e.g., opposite) surface of the electronic device 10.

The housing 500 may be an external case exposed outwardly of the electronic device 10. As an example, when a touch sensing module is applied to the electronic device 10 and the electronic device 10 is a mobile device, the housing 500 may be a cover disposed on a side surface of the electronic device 10. The housing 500 may be integrated with the rear glass 53, which may be disposed on a rear surface of the electronic device 10, or may be separated from the rear glass 53, which may be disposed on the rear surface of the electric device 10.

The electronic device 10 may include a touch switch unit TSW. The touch switch unit TSW may be disposed on the housing 500, but is not limited to being disposed in the housing 500. In addition, the touch switch unit TSW may include a single switch unit or may include a plurality of switch units, as illustrated in FIG. 1.

Hereinafter, a description will be provided of examples in which a plurality of switch units are included in the touch switch unit TSW, and the switch units will be defined as a first touch member TM1, a second touch member TM2, and the like.

As described above, when a plurality of touch members (e.g., the first touch member TM1 and the second touch member TM2) are included in the touch switch unit TSW, the touch members may be implemented as switches having different functions. For example, the first touch member TM1 may function as a volume-down switch, and the second touch member TM2 may function as a volume-up switch.

For example, a touch switch unit TSW including three touch members may include touch members respectively serving as a volume-down switch, a volume-up switch, and a power (on/off) switch. However, the functions of the touch members described above are only examples, and functions of the touch members may be variously set such that the touch members are used depending on type or characteristics of an electronic device.

In the description herein, "touch" or "touch application" may include a contact touch, performed to contact the touch switch unit TSW without an accompanying force, and a force touch performed to press the touch switch unit TSW with an accompanying force (e.g., pressure). Therefore, it will be understood that the term "touch" is an operation including at least one of the contact touch and the force touch.

Referring to FIG. 1, the electronic device 10 is not limited to a specific device and may include, without limitation, an electronic device having a switch for controlling an operation, for example, a portable device such as a smartphone, a wearable device such as a smartwatch, or the like.

The electronic device 10 may correspond to, for example, a smartphone, a personal digital assistant (PDA), a digital video camera, a digital still camera, a network system, a computer, a monitor, a tablet PC, a laptop PC, a netbook PC, a television, a video game machine, a smartwatch, an automotive, or the like.

In the case of an electronic device such as a general mobile phone, a volume button or a power button may be formed as a physical button (key) on a side portion of the general mobile phone. In this case, a physical button should protrude so that a human hand may press the physical button. However, when a physical button is used, the physical button has limited endurance period due to physical wear, or the like. In addition, the protruding shape of the physical button may make it difficult to implement a waterproof structure.

Hereinafter, example touch sensing modules and electronic devices configured to address the above issues will be described with reference to FIGS. 2 to 7.

Regarding components having the same reference symbol and the same function in examples of respective drawings, unnecessary overlapping descriptions thereof may be omitted, while differences between examples of respective drawings may be described.

A structure and an operating method of a touch sensing module including two touch members (the first touch member TM1 and the second touch member TM2), according to an example, are illustrated in FIGS. 2 to 5, so that the one example will be described with reference to the drawings.

Figure 2:
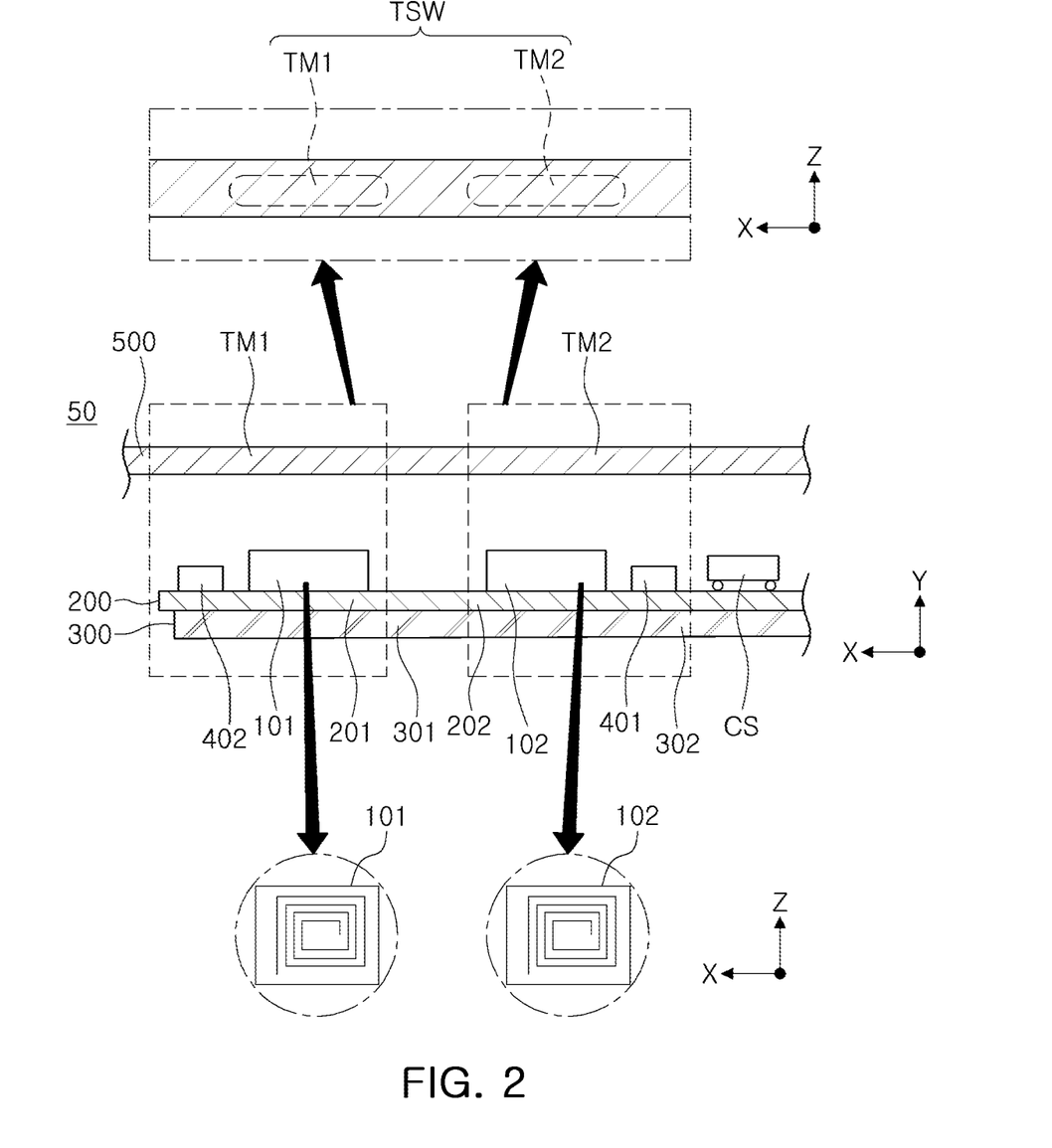
FIG. 2 is a view illustrating an example of a cross-sectional structure (an X-Y cross section) relative to one side surface of the electronic device of FIG. 1.
Figure 3:
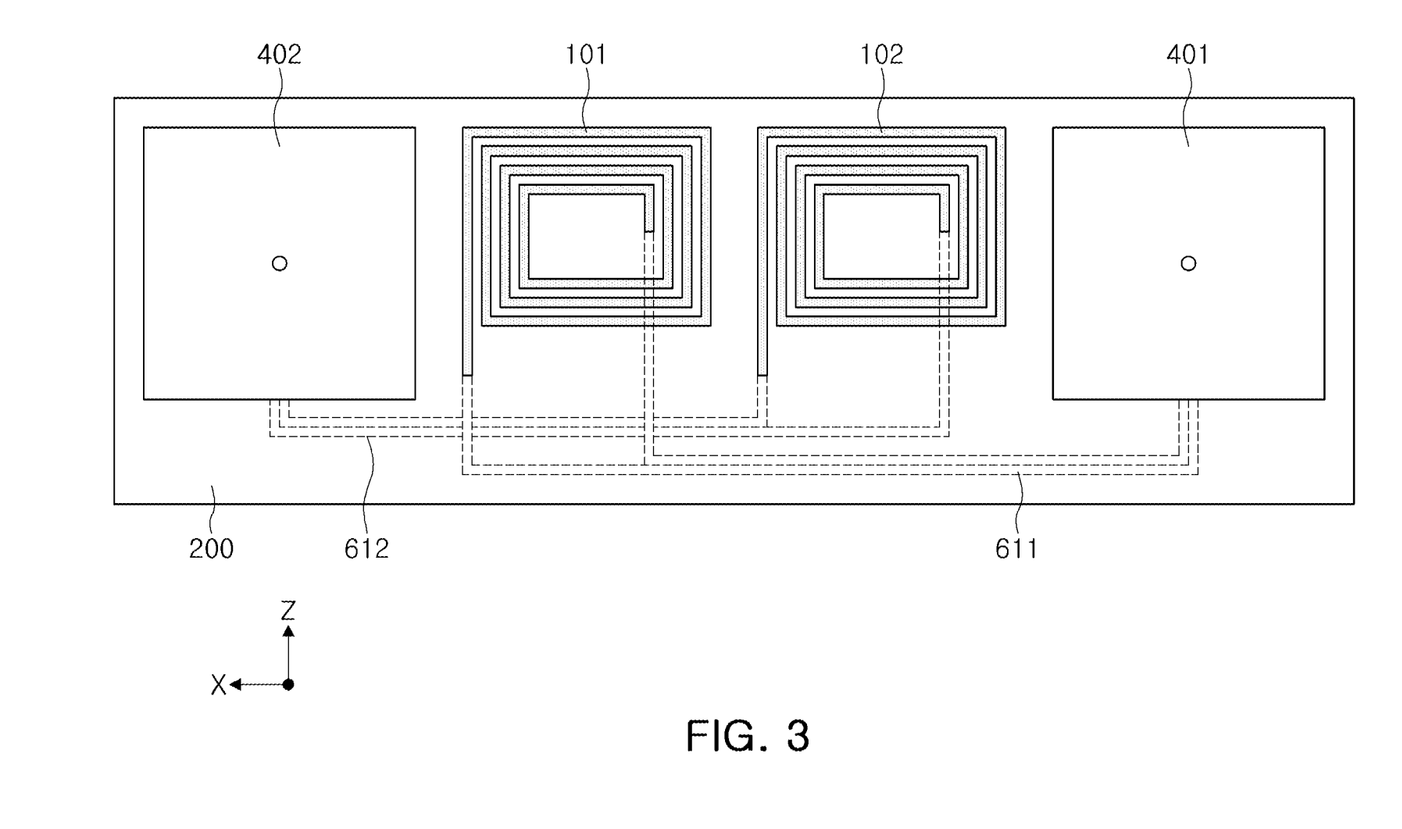
FIG. 3 is a view illustrating an example of a structure in which sensing coils and pads, included in a touch sensing module of FIG. 2, are connected to each other.
Figure 4A:
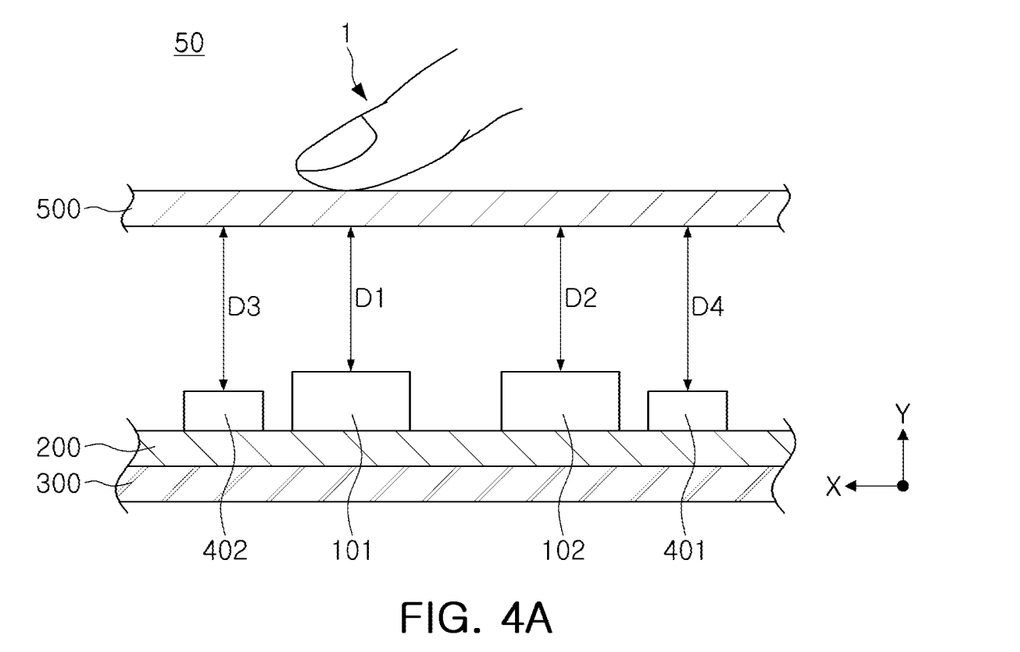
FIG. 4A and FIG. 4B are schematic views illustrating an example of a change depending on a touch applied to a touch switch unit of FIG. 2.
Figure 4B:
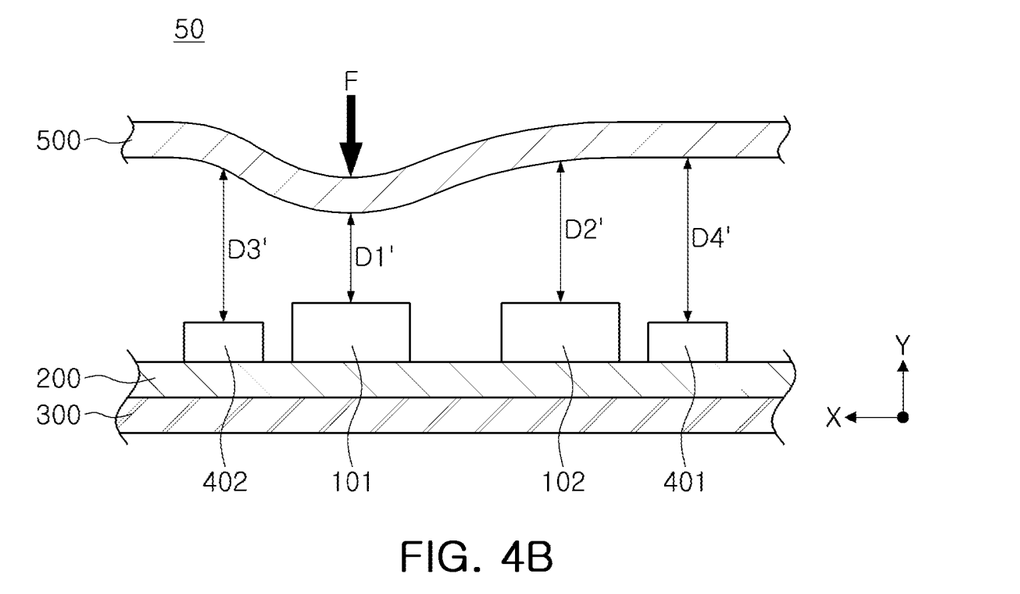
Figure 5:
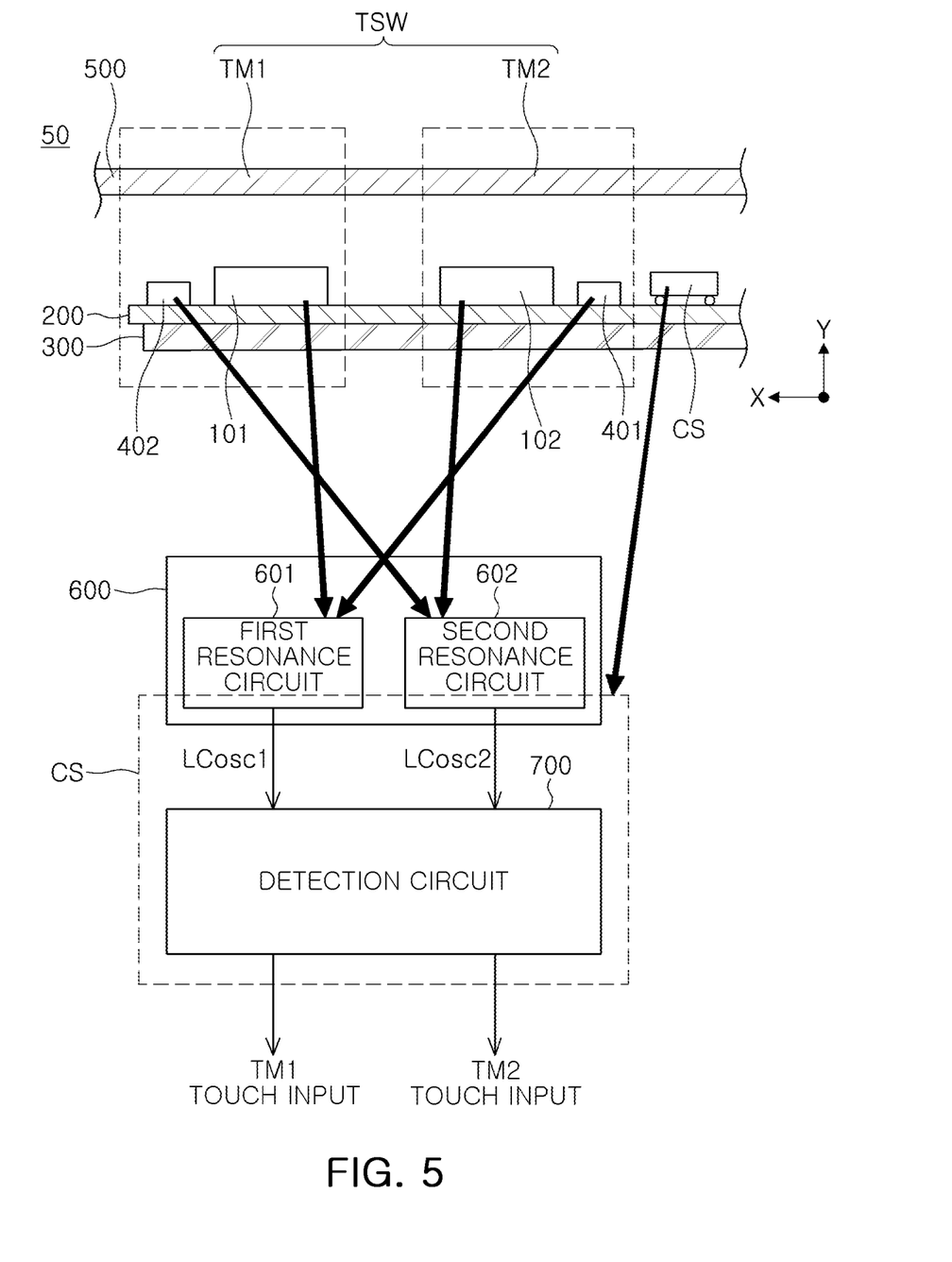
FIG. 5 is a schematic view illustrating an example of a connection structure of circuits included in the touch sensing module of FIG. 2.

FIG. 2 is a view illustrating an example of a cross-sectional structure (an X-Y cross section) relative to one side surface of the electronic device 10 of FIG. 1. FIG. 3 is a view illustrating an example of a structure in which sensing coils 101 and 102 and pads 401 and 402, included in a touch sensing module of FIG. 2, are connected to each other. FIG. 4A and FIG. 4B are schematic views illustrating an example of a change depending on a touch applied to the touch switch unit TSW of FIG. 2, and FIG. 5 is a schematic view illustrating an example of a connection structure of circuits 600 and 700 included in the touch sensing module of FIG. 2.

Referring to FIGS. 1 and 2, for example, one side surface of the electronic device 10 may be provided with the housing 500 corresponding to a side cover, and at least a certain region of the housing 500 may be provided with a touch switch unit TSW. For reference, the other side surface of the electronic device 10 may be provided with another touch switch unit. The description of the touch switch unit TSW on the one side surface may be equivalently applied to the touch switch unit on the other side surface.

The touch switch unit TSW may include a plurality of touch members. For example, as illustrated in FIG. 2, the first touch member TM1 and the second touch member TM2 may be arranged parallel to each other to constitute the touch switch unit TSW. A shape of each touch member and a structure, in which a plurality of touch members are arranged, may be variously modified. The shape and the structure illustrated in FIG. 2 are only one of various examples.

In addition, a demarcation line or surface may not be provided between the plurality of touch members TM1 and TM2. Accordingly, both side surfaces of the electronic device 10 may have a seamless exterior.

However, in this case, a portion of force may be transferred to a touch member depending on strength of a force touch applied to each touch member, thereby causing a malfunction.

Accordingly, in the disclosure herein, when a force is simultaneously transmitted to proximate touch members by a user's touch application operation, a touch input signal may be generated in only a touch member that a user intended to press (for example, one specific switch) to reduce occurrence of a malfunction. For example, as illustrated in FIGS. 2 to 5, the electronic device 10 may include a touch sensing module 50 including first and second sensing coils 101 and 102 respectively disposed below the first and second touch members TM1 and TM2, and first and second pads 401 and 402 respectively disposed below the second and first touch members TM2 and TM1, to clearly distinguish signals between different touch switches.

The touch sensing module 50 may be inserted in the housing 500 to be disposed on an inner-side spaced apart from the housing 500. The touch sensing module 50 may sense a touch input applied to the touch switch unit TSW.

More specifically, the touch sensing module 50 may detect a force touch input using an inductive sensing method and a capacitance sensing method. For example, a touch input signal may be generated based on a result of inductive sensing performed by the first and second sensing coils 101 and 102, and capacitance sensing performed by the first and second pads 401 and 402, together.

As illustrated in FIG. 4A and FIG. 4B, as a user applies a touch to the touch switch unit TSW, the housing 500 may be inwardly bent around a point at which the touch is applied ("touch application point"). Thus, a size of an air gap formed by the sensing coils 101 and 102 and the housing 500 may be changed.

The change in size of the air gap may lead to a change in inductance. When a change in inductance greater than or equal to a reference value is sensed, the touch sensing module 50 may detect that a touch input, performed by a force, was applied to the touch switch unit TSW.

In addition, as the user applies a touch to the touch switch unit TSW, a size of an air gap formed by the pads 401 and 402 and the housing 500 may also be changed. In this case, each of the pads 401 and 402 may encounter a change in capacitance.

The touch sensing module 50 may simultaneously sense such a change inductance and such a change in capacitance to more clearly distinguish touch operations between proximate sensors using amplification of the magnitude of a signal.

Referring to FIGS. 2 and 3, the touch sensing module 50 may include the first and second sensing coils 101 and 102, the first and second pads 401 and 402, a substrate 200, a bracket 300, and a sensing circuit CS. The first and second sensing coils 101 and 102 may be disposed on the substrate 200, and the substrate 200 may be fixed to an internal space of the housing 500 by the bracket 300.

The first sensing coil 101 may be disposed on an inner-side portion spaced apart from the first touch member TM1, and the second sensing coil 102 may be disposed on an inner-side portion spaced apart from the second touch member TM2. For example, the first and second sensing coils 101 and 102 may be disposed to be spaced apart from the housing 500, and the first sensing coil 101 may be disposed in a position facing the first touch member TM1 and the second sensing coil 102 may be disposed in a position facing the second touch member TM2. The touch members TM1 and TM2 may be spaced apart from and the sensing coils 101 and 102, respectively, by a predetermined distance to form an air gap therebetween.

A shape of each of the first and second sensing coils 101 and 102 is not necessarily limited. In FIG. 2, a coil pattern of the first and second sensing coils 101 and 102 is illustrated as having a rectangular shape. However, a coil pattern may be formed to have various shapes such as a circular shape, a track shape, and the like. In addition, each of the first and second sensing coils 101 and 102 may be implemented by forming a wiring pattern on a printed circuit board (PCB) or a flexible PCB (FPCB), or by providing a chip inductor.

Each of the first and second sensing coils 101 and 102 may have an inductance that varies as a force touch is applied. For example, the housing 500 may be formed of a conductive material such as a metal, and a change in inductance may be caused by a change in separation distance between the housing 500 and each of the first and second sensing coils 101 and 102 (for example, a size of the air gap). Accordingly, the touch sensing module 50 may sense the change in inductance induced in each of the sensing coils 101 and 102, to perform inductive sensing to sense a touch input.

For example, as illustrated in FIG. 4A and FIG. 4B, when a user's hand 1 applies a touch accompanied by a force F to one region of the housing 500, the housing 500 may be inwardly bent around the touch application point. In this case, a separation distance between the first sensing coil 101 and the housing 500 may decrease from D1 to D1'.

While the separation distance is changed, current may flow through the first sensing coil 101, and the magnitude of eddy current may vary depending on a change in distance to the housing 500, which is a neighboring conductor. In addition, the inductance of the first sensing coil 101 may be decreased (Lind-ΔLind) by the magnitude-varied eddy current. The touch sensing module 50 may detect such a change in inductance to determine whether a touch input is applied.

When the housing 500 is bent around the touch application point, a neighboring portion adjacent to the touch application point may also be inwardly bent gradually. Therefore, the separation distance between the second sensing coil 102 and the housing 500 may decrease from D2 to D2'. For example, FIG. 4A and FIG. 4B illustrate an example in which a touch is applied in the vicinity of the first touch member TM1, and the decrease from D2 to D2' is less than the decrease from D1 to D1'.

While the separation distance is changed, current may flow through the second sensing coil 102, and the magnitude of the eddy current may vary depending on the change in the distance to the housing 500, which is a neighboring conductor. In addition, the inductance of the second sensing coil 102 may be decreased (Lind-ΔLind) by the magnitude-varied eddy current. In this case, since the decrease from D2 to D2' is less than the decrease from D1 to D1', the amount of the change in the inductance of the second sensing coil 102 is less than the amount of the change in the inductance of the first sensing coil 101.

As shown in FIG. 2, the substrate 200 may be configured for the first and second sensing coils 101 and 102, the first and second pads 401 and 402, and the sensing circuit CS to be mounted thereon. As an example, the substrate 200 may include a first substrate 201 on which the first sensing coil 101 and the second pad 402 are mounted, and a second substrate 202 on which the second sensing coil 102 and the first pad 401 are mounted.

The first substrate 201 and the second substrate 202 may be independent of each other or may be integrated into a single substrate 200, as illustrated in FIG. 2. The substrate 200 may correspond to an FPCB, but is not limited thereto. For example, the substrate 200 may be one selected from various substrates, each having a structure in which at least one metal layer and at least one wiring layer are alternately stacked, other than the FPCB.

The bracket 300 may support the substrate 200 to maintain a first predetermined interval (separation distance) D1 between the first sensing coil 101 and the first touch member TM1, and a second predetermined interval D2 between the second sensing coil 102 and the second touch member TM2. Since the bracket 300 supports the substrate 200, a third predetermined interval D3 between the second pad 402 and the first touch member TM1 and a fourth predetermined interval D4 between the first pad 401 and the second touch member TM2 may also be maintained. As an example, the bracket 300 may include a first bracket 301 supporting the first substrate 201, and a second bracket 302 supporting the second substrate 202.

The first bracket 301 and the second bracket 302 may be independent of each other or may be integrated into a single bracket 300, as illustrated in FIG. 2. The bracket 300 may be formed of a conductor, such as a metal, but a material of the bracket 300 is not limited to metal.

The bracket 300 may be attached to an internal structure of the electronic device 10 to which the touch sensing module 50 is applied, or may be supported by an additional support member. In addition, the bracket 300 may have any structure as long as the bracket 300 maintains the separation distances between the sensing coils 101 and 102 and the pads 401 and 402 and the housing 500 at the predetermined first to fourth intervals D1, D2, D3, and D4, respectively.

The touch sensing module 50 may include the first and second pads 401 and 402. The first pad 401 may be disposed on the inner-side portion spaced apart from the second touch member TM2, and the second pad 402 may be disposed on the inner-side portion spaced apart from the first touch member TM1. For example, the first and second pads 401 and 402 may be disposed to be spaced apart from the housing 500, and the second pad 402 may be disposed in a position facing the first touch member TM1, and the first pad 401 may disposed in a position facing the second touch member TM2. The first and second touch members TM1 and TM2 may be spaced apart from the second and first pads 402 and 401, respectively, by a predetermined distance to form an air gap therebetween.

A shape of each of the first and second pads 401 and 402 is not necessarily limited. For example, the first and second pads 401 and 402 may be any of various devices used by a person skilled in the art to sense a user's contact touch. Accordingly, various components constituting the first and second pads 401 and 402 and internal structures thereof may also be provided.

As an example, the first and second pads 401 and 402 may include a pair of electrodes having opposite polarities, and the electrodes may be electrically connected to the first and second sensing coils 101 and 102, respectively, the sensing circuit CS, and the like.

Each of the first and second pads 401 and 402 may have capacitances varying as a contact touch is applied. For example, the housing 500 may be formed of a conductive material such as a metal. When a contact touch made by the user's hand 1 is applied to the housing 500, a contacted medium may be changed to cause a change in capacitance sensed by each of the pads 401 and 402.

In this case, a separation distance between each of the pads 401 and 402 and a point at which a contact touch is made by the user's hand 1, may also have an effect on the amount of change in the capacitance. For example, as illustrated in FIG. 4A and FIG. 4B, when a contact touch is made in the vicinity of the first touch member TM1, the change of the contact medium made by the user's hand 1 may have a stronger effect on the second pad 402, which is close to the first touch member TM1, than on the first pad 401.

In addition, when a force accompanies such a contact touch, a change in the size of the air gap caused thereby may also have an effect on the amount of change in the capacitance of the first and second pads 401 and 402. For example, as illustrated in FIG. 4A and FIG. 4B, when a force touch is applied in the vicinity of the first touch member TM1, a greater change in capacitance may be induced in the second pad 402, which is located in a position corresponding to a location in which the housing 500 is further bent inwardly, than in the first pad 401.

In view of both the above-mentioned two effects, when a touch is applied in the vicinity of the first touch member TM1, a relatively large change in capacitance occurs in the second pad 402 and a relatively small change in capacitance occurs in the first pad 401. Accordingly, the touch sensing module 50 may perform capacitive sensing to sense a change in capacitance induced to each of the pads 401 and 402, to detect a touch input.

Referring to FIG. 3, the first pad 401 may be disposed to be closer to the second sensing coil 102 than to the first sensing coil 101, and may be electrically connected to the first sensing coil 101. In this case, the first sensing coil 101 and the first pad 401 may be connected to each other through, for example, a first connection conductor 611.

The second pad 402 may be disposed to be closer to the first sensing coil 101 than to the second sensing coil 102, and may be electrically connected to the second sensing coil 102. In this case, the second sensing coil 102 and the second pad 402 may be connected to each other through, for example, a second connection conductor 612.

As described above, the first sensing coil 101 and the second pad 402 may be disposed to be proximate to each other, and the second sensing coil 102 and the first pad 401 may be disposed to be proximate to each other. Thus, a structure in which electrically connected components are disposed to intersect each other may be formed. In this case, the structure may be any structure as long as electrically connected components are disposed to intersect each other and a separation distance between the components is not necessarily limited.

For example, as illustrated in FIGS. 2 to 5, the first and second sensing coils 101 and 102 are spaced apart from each other by a predetermined distance, and the second pad 402 and the first pad 401 may be symmetrically disposed outside the first and second sensing coils 101 and 102, respectively.

The first sensing coil 101 and the first pad 401, which are electrically connected to each other, and the second sensing coil 102 and the second pad 402, which are electrically connected to each other, may constitute a resonance circuit 600. For example, as illustrated in FIG. 5, the first sensing coil 101 and the first pad 401 may constitute a first resonance circuit 601 generating a first resonance signal LCosc1 having a resonant frequency varying as a touch is applied. The second sensing coil 102 and the second pad 402 may constitute a second resonance circuit 602 generating a second resonance signal LCosc2 having a resonant frequency varying as a touch is applied.

The first and second resonance circuits 601 and 602 may be electrically connected to the sensing circuit CS. As an example, as illustrated in FIG. 5, the sensing circuit CS may include a detection circuit 700, and each of the first and second resonance circuits 601 and 602 may be electrically connected to the detection circuit 700.

As another example, the sensing circuit CS may include at least a portion of the first and second resonance circuits 601 and 602. For example, the sensing circuit CS may correspond to an integrated circuit (IC) including the first and second pads 401 and 402 and the detection circuit 700. In this example as well as the above-describe example, since the range of the sensing circuit CS may vary depending on the type of connection between circuits, the sensing circuit CS is not limited to a specific configuration and type.

As described above, as a touch is applied to the touch switch unit TSW, the housing 500 may be inwardly bent and a change in inductance may be induced in each of the first and second sensing coils 101 and 102. In addition, since the touch includes a contact touch, a change in capacitance may be induced in each of the first and second pads 401 and 402 as the touch is applied.

A change in inductance and a change in capacitance may lead to a change in resonant frequencies of the first and second resonance signals LCosc1 and LCosc2 generated by the first and second resonance circuits 601 and 602. In this case, according to an example, a direction of a change in resonant frequency, caused by the change in inductance, may be different from a direction of a change in resonant frequency caused by the change in capacitance.

For example, as a touch is applied, the inductance of each of the first and second sensing coils 101 and 102 may be decreased, and thus, may be changed in a direction in which the resonant frequency of each of the first and second resonance signals LCosc1 and LCosc2 is increased. In addition, as a touch is applied, the capacitance of each of the first and second pads 401 and 402 may be increased, and thus, may be changed in a direction in which the resonant frequency of each of the first and second resonance signals LCosc1 and LCosc2 is decreased.

As illustrated in FIG. 4A and FIG. 4B, the case in which a touch is applied in the vicinity of the first touch member TM1 is given as an example. In this case, since the separation distance D1 between the first sensing coil 101 and the housing 500 is changed by a relatively large amount a touch is applied, the resonant frequency of the first resonance circuit 601 may be increased by a relatively large amount (for example, an increase by 5 MHz).

Meanwhile, since a separation distance D2 between the second sensing coil 102 and the housing 500 is changed by a relatively small amount, the resonant frequency of the second resonance circuit 602 may be increased by a relatively small amount (for example, increased by an amount of 2 MHz).

As described above, the amount of the change in capacitance, induced in the first and second pads 401 and 402, may vary depending on a touch application position. Therefore, as illustrated in FIG. 4A and FIG. 4B, in the case in which a touch is applied in the vicinity of the first touch member TM1, capacitance of the second pad 402, which is disposed to be relatively close to the first touch member TM1, may be increased by a relatively large amount. Accordingly, the resonant frequency of the second resonance circuit 602 may be decreased by a relatively large amount (for example, decreased by an amount of 3 MHz).

Meanwhile, as the touch is applied, the capacitance of the first pad 401, which is disposed to be relatively far from the first touch member TM1, may be increased by a relatively small amount. Accordingly, the resonant frequency of the first resonant circuit 601 may be decreased bay a relatively small amount (for example, decreased by an amount of 0.5 MHz).

The first resonance circuit 601 may generate the first resonance signal LCosc1 based on a result of the sum of a change in resonant frequency depending on the change in inductance of the first sensing coil 101 and a change in the resonant frequency depending on the change in capacitance of the first pad 401. In addition, the second resonant circuit 602 may generate the second resonance signal LCosc2 based on a result of the sum of a change in resonant frequency depending on the change in inductance of the second sensing coil 102 and a change in resonant frequency depending on the change in capacitance of the second pad 402.

Therefore, according to the above-described example values, as a touch is applied to the first touch member TM1, the resonant frequency of the first resonance signal LCosc1 is increased by 5 MHz and simultaneously decreased by 0.5 MHz. As a result, the resonant frequency of the first resonance signal LCosc1 is increased by 4.5 MHz in total. On the other hand, the resonant frequency of the second resonance signal LCosc2 is increased by 2 MHz and simultaneously decreased by 3 MHz. As a result, the resonant frequency of the second resonance signal LCosc2 is decreased by 1 MHz in total.

When the above result is compared with the touch sensing module according to the related art including only a sensing coil, the following result is obtained. When a touch is applied to the touch sensing module according to the related art, a change in resonant frequency is induced by a change in inductance caused by each sensing coil. When the sensing coil of the touch sensing module according to the related art is the same as a sensing coil of the example herein, resonant frequencies of the sensing coil of the touch sensing module according to the related art may be increased by 5 MHz and 2 MHz, respectively. Therefore, a difference between the resonant frequencies of resonance signals, respectively generated by resonant circuits, is 3 MHz.

Meanwhile, when a touch is applied to the touch sensing module 50 according to the example herein, the resonant frequency of the first resonance signal LCosc1 is increased by 4.5 MHz and the resonant frequency of the second resonance signal LCosc2 is decreased by 1 MHz. Therefore, a difference between the resonant frequencies of the first and second resonance signals LCosc1 and LCosc2 is 5.5 MHz.

As a result, it can be confirmed that a difference between the resonant frequencies of the two resonance signals LCosc1 and LCosc2 is further increased according to the embodiment disclosed herein. In other words, the first sensing coil 101 and the first pad 401, which are electrically connected to each other, and the second sensing coil 102 and the second pad 402, which are electrically connected to each other, may be alternately disposed to increase the difference the resonant frequencies of the first and second resonance signals LCosc1 and LCosc2, respectively generated by the first and second resonant circuits 601 and 602. Accordingly, signals between adjacent sensors may be more clearly separated to reduce occurrence of a malfunction.

Referring to FIG. 5, first and second resonance signals LCosc1 and LCosc2, respectively generated by the first and second resonance circuits 601 and 602, may be transmitted to the detection circuit 700. The detection circuit 700 may be electrically connected to the first and second resonance circuits 601 and 602, and may determine a touch application position based on the change in the resonant frequencies of the generated first and second resonance signals LCosc1 and LCosc2.

More specifically, the detection circuit 700 may determine that a touch is applied to a resonance circuit having a greater amount of change in the resonant frequency among the amounts of change in the resonant frequencies of the first and second resonance signals LCosc1 and LCosc2. For example, when the amount of change in the resonant frequency of the first resonance signal LCosc1 is greater, the detection circuit 700 may determine that the touch is applied to the first touch member TM1. When the amount of change in the resonant frequency of the second resonance signal LCosc2 is greater, the detection circuit 700 may determine that a touch is applied to the second touch member TM2.

For example, as illustrated in FIG. 4A and FIG. 4B, when a touch is applied to the first touch member TM1, a change in the separation distance between the first touch member TM1 and the first sensing coil 101 may be greater than a change in the separation distance between the second touch member TM2 and the second sensing coil 102. Accordingly, a change in the inductance of the first sensing coil 101 and a change in the first resonant frequency (for example, an increase by 5 MHz) caused by the change in the inductance of the first sensing coil 101, may be greater than a change in the inductance of the second sensing coil 102 and a change in the second resonant frequency (for example, an increase by 2 MHz) caused by the change in the inductance of the second sensing coil 102.

In addition, the effect of a contact touch applied to the first touch member TM1, is greater on the second pad 402 than on the first pad 401. Therefore, a change in the capacitance of the second pad 402 and a change in the first resonant frequency (for example, decreased by 3 MHz), caused by the change in the capacitance of the second pad 402, may be greater than a change in the capacitance of the first pad 401 and a change in the first resonant frequency (For example, decreased by 0.5 MHz) caused by change in the capacitance of the first pad 401.

When the changes made by the inductive sensing and the capacitive sensing are summed, the first resonant frequency is increased by 4.5 MHz and the second resonant frequency is decreased by 1 MHz.

The detection circuit 700 may compare the first and second resonant frequencies with each other to determine that the amount of change in the first resonant frequency is greater than the amount of change in the second resonant frequency. Thus, the detection circuit 700 may determine that a touch is applied to the first touch member TM1, and may generate a touch input signal corresponding to the first touch member TM1.

When a touch is applied to the second touch member TM2, the amount of change in the second resonant frequency may be greater than the amount of change in the first resonant frequency. Then, the detection circuit 7000 may compare the first and second resonant frequencies with each other to determine that the amount of change in the second resonant frequency may be greater than the amount of change in the first resonant frequency, and may generate a touch input signal corresponding to the second touch member TM2.

Figure 6:
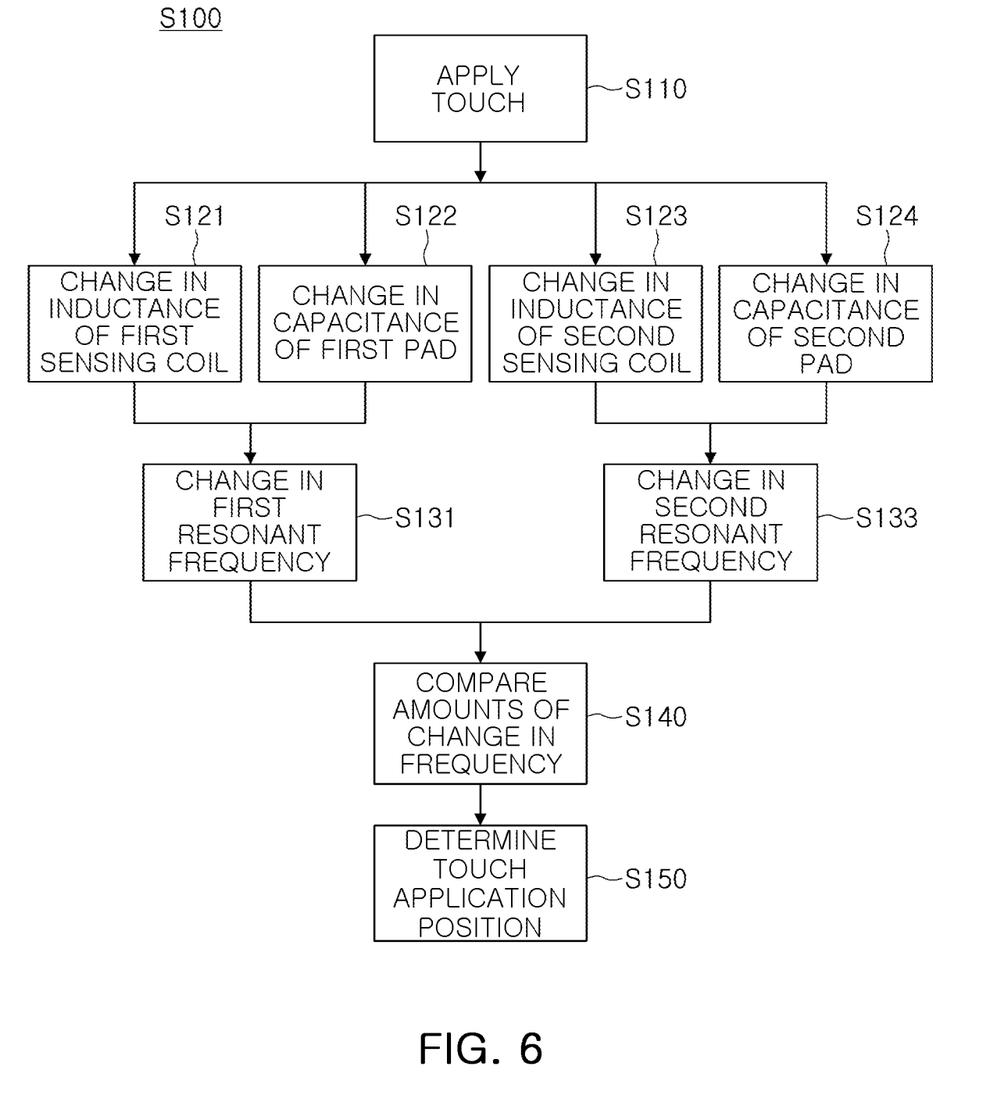
FIG. 6 is a view illustrating an example of a change occurring when a touch is applied to the touch sensing module of FIG. 2 and a sensing method based on the change.

FIG. 6 is a view illustrating an example of a change occurring when a touch is applied to the touch sensing module of FIG. 2 and a sensing method S100 based on the change.

Referring to FIGS. 2 to 6, when a touch is applied to the touch switch unit TSW of the touch sensing module 50 in operation S110, changes in inductances of the first and second sensing coils 101 and 102 and changes in capacitances of the first and second pads 401 and 402 may be made in operations S121, S122, S123, and S124. In this case, the amount of the change in each inductance and the amount of the change in each capacitance may vary depending on a touch application position.

For example, as illustrated in FIG. 4A and FIG. 4B, when the touch is applied to the housing 500 in a position proximate to the first sensing coil 101, the amount of change in the inductance of the first sensing coil 101 is greater than the amount of change in inductance of the second sensing coil 102. In addition, since the second pad 402 is disposed to be proximate to the first sensing coil 101, the amount of change in the capacitance of the second pad 402 is greater than the amount of change in the capacitance of the first pad 401.

Since the first sensing coil 101 and the first pad 401 are electrically connected to each other to constitute the first resonant circuit 601, the amount of change in the resonant frequency of the first resonant circuit 601 may be determined by a result of summing the amount of change in the resonant frequency induced by the change in inductance of the coil 101 in operation S121, and the amount of change in the resonant frequency induced by the change in the capacitance of the first pad 401 in operation S122.

In addition, since the second sensing coil 102 and the second pad 402 are electrically connected to each other to form the second resonant circuit 602, the amount of change in the resonant frequency of the second resonant circuit 602 is determined by a result of summing the amount of change in the resonant frequency induced by the change in the inductance of the coil 102 and the amount of change in the resonant frequency induced by the change in the capacitance of the second pad 402.

Accordingly, as illustrated in FIG. 6, the change in the inductance of the first sensing coil 101 occurring in operation S121) and the change in the capacitance of the first pad 401 occurring in operation S122) may be reflected together in the first resonance signal LCosc1 generated by the first resonance circuit 601, to make a change of the first resonant frequency in operation S131. In addition, the change in the inductance of the second sensing coil 102 occurring in operation S123 and the change in the capacitance of the second pad 402 occurring in operation S124 may be reflected together in the second resonance signal LCosc2 generated by the second resonance circuit 602, to make a change in the second resonant frequency in operation S133.

In this case, the changes in the resonant frequency induced by the change in the inductance and the change in the capacitance may be made in different directions. For example, as the housing 500 is approached, the inductance of each of the sensing coils 101 and 102 may be changed in a decreasing direction, and thus, the resonant frequency may be changed in an increasing direction. Meanwhile, as the housing 500 is approached, the capacitance of each of the pads 401 and 402 may be changed in an increasing direction, and, thus, the resonant frequency may be changed in a decreasing direction.

In addition, as illustrated in FIGS. 2 and 5, the first and second sensing coils 101 and 102 and the first and second pads 401 and 402 are disposed to intersect each other. Therefore, the changes in the resonant frequency induced by the first and second pads 401 and 402, may compensate for the changes in the resonant frequency induced by the first and second sensing coils 101 and 102.

For example, when a touch is applied to the first touch member TM1, the first resonant frequency may be increased by about 5 MHz by the first sensing coil 101, and the second resonant frequency may be increased by about 3 MHz by the second sensing coil 102. Thus, a difference in amounts of the changes between the first and second resonant frequencies may be 2 MHz.

In this case, the first resonant frequency may be decreased by about 0.5 MHz by the first pad 401, and the second resonant frequency may be decreased by about 2 MHz by the second pad 402. Then, when the changes induced by the sensing coils 101 and 102 and the pads 401 and 402 are summed up, a difference between the amounts of changes in the first and second resonant frequencies may be 3.5 MHz. For example, it is confirmed that the first and second pads 401 and 402 may perform a compensation operation to further increase the difference between the amounts of changes in the first and second resonant frequencies.

The detection circuit 700 may detect the change in the first resonant frequency and the change in the second resonant frequency, and may compare the amounts in the changes in the first and second resonant frequencies with each other in operation S140. In addition, the detection circuit 700 may determine a touch application position based on a result of the comparison, in operation S150.

For example, when the amount of change in the first resonant frequency is greater than the amount of change in the second resonant frequency, the detection circuit 700 may determine that a touch was applied to the first touch member TM1. When the amount of change in the second resonant frequency is greater than the amount of change in the first resonant frequency, the detection circuit 700 may determine that a touch was applied to the touch member TM2. In addition, the detection circuit 700 may generate a touch input signal corresponding to the determined touch application position.

According to a modified example, the number of sensing coils and pads included in the touch sensing module 50 may be changed in various ways to obtain an effect of reducing a malfunction between three or more proximate sensors.

Figure 7:
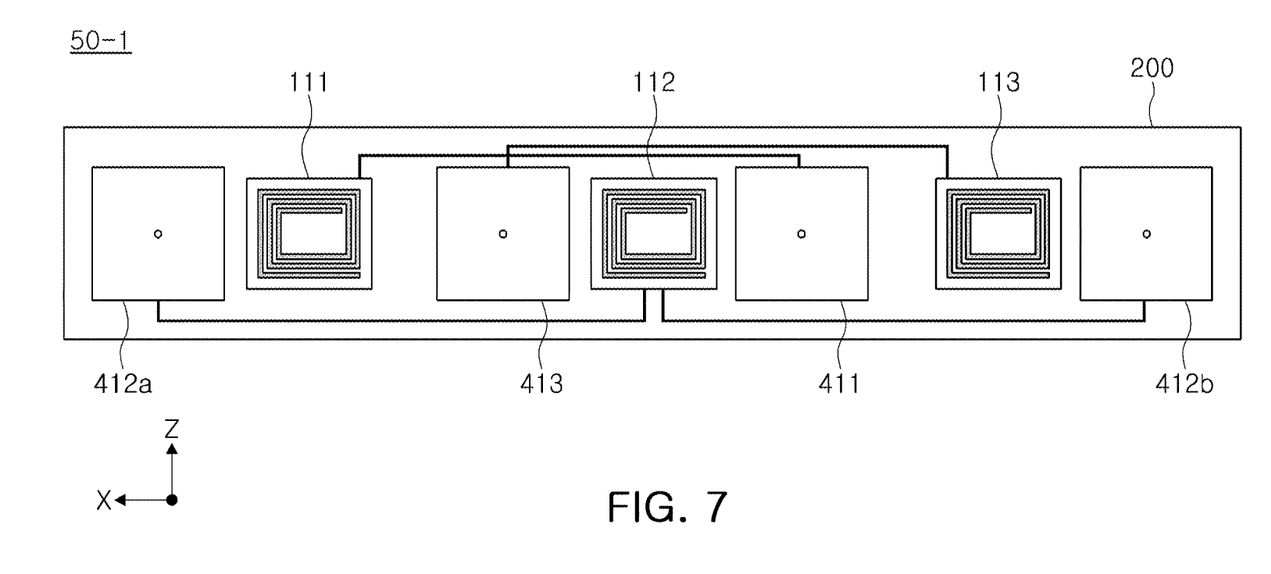
FIG. 7 is a view illustrating an example of a structure in which sensing coils and pads of a touch sensing module, according to an example, are connected to each other.
Figure 8:
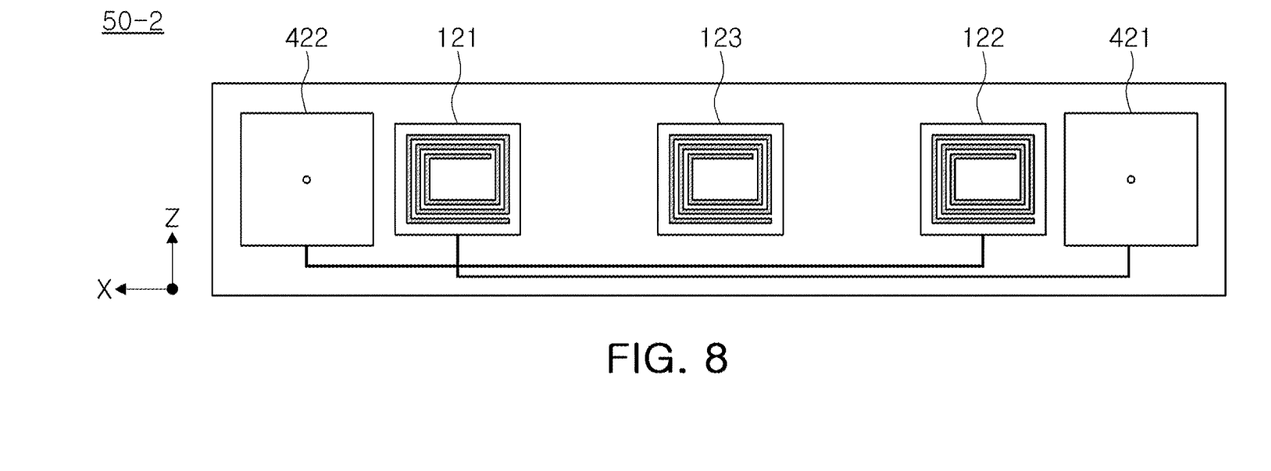
FIG. 8 is a view illustrating an example of a structure in which sensing coils and pads of a touch sensing module, according to another example, are connected to each other.

FIG. 7 is a view illustrating an example of a structure in which sensing coils and pads of a touch sensing module 50-1, according to an example, are connected to each other. FIG. 8 is a view illustrating an example of a structure in which sensing coils and pads of a touch sensing module 50-2, according to another example, are connected to each other.

Referring to FIG. 7, the touch sensing module 50-1 may include first and second sensing coils 111 and 112, and first and second pads 411 and 412a, similarly to the touch sensing module 50 illustrated in FIGS. 2 to 5. The touch sensing module 50-1 further includes a third sensing coil 113, a third pad 413, and an additional second pad 412b.

The first sensing coil 111 and the first pad 411 may be electrically connected to each other to constitute a first resonance circuit generating a first resonance signal. In addition, the second sensing coil 112 and the second pad 412a may be electrically connected to each other to constitute a second resonance circuit generating a second resonance signal.

Similarly to the first and second sensing coils 111 and 112, the third sensing coil 113 may have inductance varying as a force touch is applied. As illustrated in FIG. 7, the third sensing coil 113 may be spaced apart from the second sensing coil 112 by a predetermined distance to be symmetrical with respect to the first sensing coil 111 about the second sensing coil 112.

Similarly to the first and second pads 411 and 412a, the third pad 413 and the additional second pad 412b may have capacitances varying as a contact touch is applied. The third pad 413 may be disposed to be closer to the second sensing coil 112 than the first and third sensing coils 111 and 113, and may be electrically connected to the third sensing coil 113.

Accordingly, the third sensing coil 113 and the third pad 413, which are electrically connected to each other, may constitute a third resonance circuit. In addition, as a touch input is applied, a resonant frequency of a third resonance signal generated by the third resonance circuit may be changed. The third resonance circuit may be electrically connected to the detection circuit 700 illustrated in FIG. 5, and thus, a change in the resonant frequency of the third resonance signal may be detected by the detection circuit 700.

The additional second pad 412b may be disposed to be closer to the third sensing coil 113 than to the first and second sensing coils 111 and 112, and may be electrically connected to the second sensing coil 112. For example, the second pad 412a and the additional second pad 412b may be connected together to the second sensing coil 112.

Accordingly, the second sensing coil 112 and the additional second pad 412b, electrically connected to each other, may constitute an additional second resonance circuit, and a resonant frequency of an additional second resonance signal generated by the additional second resonant circuit may be changed as a touch input is applied. The additional second resonance circuit may be electrically connected to the detection circuit 700 illustrated in FIG. 5, and thus, a change in the resonant frequency of the additional second resonance signal may be detected by the detection circuit 700.

When the touch sensing module 50-1 is applied to the electronic device 10, a touch switch unit TSW may include first to third touch members. For example, the first sensing coil 111 and the second pad 412a may be disposed on the inner-side portion spaced apart from the first touch member, the second sensing coil 112, the first pad 411, and the third pad 413 may be disposed on the inner-side portion spaced apart from the second touch member, and the second pad 412b, the first pad 411, and the third pad 413 may be disposed on an inner-side portion spaced apart from the third touch member.

The first sensing coil 111 and the first pad 411 may be connected to each other, the second sensing coil 112 may be connected to each of the second pad 412a and the additional second pad 412b, and the third sensing coil 113 and the third pad 413 may be connected to each other, so that components electrically connected to each other may be disposed to intersect each other.

Hereinafter, an example in which a touch is applied to a second touch member will be described. In this example, a change in separation distance between the second touch member and the second sensing coil 112 is greater than a change in separation distance between the first touch member and the first sensing coil 111 and a change in separation distance between the third touch member and the third sensing coil 113. Thus, a change in inductance of the second sensing coil 112 is greater than a change in inductance of each of the first sensing coil 111 and the third sensing coil 113. As a result, a change in the second resonant frequency (for example, an increase by 5 MHz) is greater than a change in the first resonant frequency and a change in the third resonant frequency (for example, an increase by 2 MHz).

In addition, an effect of the contact touch, applied to the second touch member, may be greater on the first and third pads 411 and 413 than on the second pad 412a and the additional second pad 412b. Thus, a change in capacitance of each of the first pad 411 and the third pad 413 is greater than a change in capacitance of each of the second pad 412a and the additional second pad 412b. As a result, a change in each of the first and third resonance frequencies (for example, an increase by 3 MHz) is greater than changes in each of the second and additional second resonance frequencies (for example, a decrease by 0.5 MHz).

When the changes made by the inductive sensing and the capacitive sensing are summed, each of the first resonant frequency and the third resonant frequency is decreased by 1 MHz, and each of the second and additional second resonant frequencies is increased by 4.5 MHz.

The detection circuit 700 may compare the first to third resonant frequencies with each other to determine that the amount of change in each of the second and additional second resonant frequencies is greater than the amount of change in each of the first and third resonant frequencies. Thus, the detection circuit 700 may determine that a touch is applied to the second touch member, and may generate a touch input signal corresponding to the second touch member.

In FIG. 7, only an example is illustrated as including three sensing coils. However, a larger number of sensing coils and pads, required for a shape, functions, and the like, of the electronic device 10, may be provided.

Referring to FIG. 8, the touch sensing module 50-2 may include first and second sensing coils 121 and 122, and second pads 421 and 422, similarly to the touch sensing module 50 illustrated in FIGS. 2 to 5. The touch sensing module 50-2 may further include at least one sensing coil disposed between the second and second sensing coils 421 and 422. For example, as illustrated in FIG. 8, the touch sensing module 50 may further include a third sensing coil 123.

The first sensing coil 121 and the first pad 421 may be electrically connected to each other to constitute a first resonance circuit generating a first resonance signal. In addition, the second sensing coil 122 and the second pad 422 may be electrically connected to each other to constitute a second resonance circuit generating a second resonance signal.

Similarly to the first and second sensing coils 121 and 122, the third sensing coil 123 may have inductance varying as a force touch is applied. The third sensing coil 123 may be disposed between the first and second sensing coils 121 and 122, as illustrated in FIG. 8.

In this example, the third sensing coil 123 may be electrically connected to a sensing circuit CS, including a pad, to have a resonant frequency varying depending on a change in inductance of the third sensing coil 123.

When the touch sensing module 50-2 is applied to the electronic device 10, a touch switch unit TSW may include first and second touch members. For example, the first sensing coil 121 and the second pad 422 may be disposed on the inner-side portion spaced apart from the first touch member, and the second sensing coil 122 and the first pad 421 may be disposed on the inner-side portion spaced apart from the second touch member. The third sensing coil 123 may be disposed between the first and second sensing coils 121 and 122.

In addition, the first sensing coil 121 and the first pad 421 may be connected to each other and the second sensing coil 122 and the second pad 422 may be connected to each other, so that components electrically connected to each other may be disposed to intersect each other.

When a touch is applied to one of the first and second touch members, sensing may be performed in the same manner as described in the example of FIGS. 2 to 5, and thus, a description of the sensing will be omitted herein. In this example, simultaneously applying touches to the first and second touch member may be sensed, which will be described in more detail below.

When touches are simultaneously applied to the first and second touch members, changes in separation distances between a housing 500 and first and second sensing coils 121 and 122 may be almost the same. Accordingly, changes in inductances of the first and second sensing coils 121 and 122 and changes in first and second resonant frequencies (for example, an increase by 5 MHz), caused by change in inductance of the first and second sensing coils 121 and 122, may be almost the same.

In addition, effects of contact touches, applied to the first and second touch members, on the first and second pads 412 and 422 may be almost the same. Accordingly, substantially the same change in capacitance may be made in the first and second pads 412 and 422, and thus, changes in the first and second resonant frequencies (for example, a decrease by 3 MHz) may also be almost the same.

When changes depending on inductive sensing and the capacitive sensing are summed, each of the first and second resonant frequencies may be increased by 2 MHz, for example. However, the exact same amount of change in resonant frequency corresponds to ideal data, and a difference between the amounts of change in the first and second resonant frequencies may actually arise according to a user's touch operation.

In this case, the detection circuit 700 may compare the first and second resonance frequencies with each other to determine a case having a greater amount of change in resonant frequency and to determine that a touch input is applied to one of the first and second touch members. For example, the detection circuit 700 may not recognize that touch inputs are simultaneously applied to the first and second touch members.

Since the touch sensing module 50-2 further includes the third sensing coil 123, a change in inductance may also arise in the third sensing coil 123 as a touch is applied. In this case, when a touch is applied to one of the first and second touch members, the change in inductance of the third sensing coil 123 may have a relatively small amount of change. However, when touches are simultaneously applied to the first and second touch members, the amount of change in the inductance of the third sensing coil 123 may be twice as large as when the touch is applied to one of the first and second touch members.

For example, when a touch is applied to the first and second touch members, a change in separation distance between the housing 500 and the third sensing coil 123 is smaller than a change in the separation distance between the housing 500 and each of the first and second sensing coils 121 and 122. Accordingly, the change in the third resonant frequency should have a lower value than the change in each of the first and second resonant frequencies (for example, an increase by 3 MHz). However, when touches are simultaneously applied to the first and second touch members, the change in the separation distance between the housing 500 and the third sensing coil 123 may be doubled. Therefore, the third resonant frequency may be increased by, for example, 6 MHz.

The detection circuit 700 may compare the first to third resonance frequencies with each other to determine the result that the third resonant frequency is greater than each of the first and second resonance frequencies. Therefore, the detection circuit 700 may determine that touches are simultaneously applied to the first and second touch members, and may generate a corresponding touch input signal.

Since the modified examples described in FIGS. 7 and 8 are just examples, a plurality of sensing coils and a plurality of pads may be disposed in various manners. Thus, touch input signals respectively applied to the touch members or simultaneously applied to the touch members may be distinguished and sensed to reduce a malfunction frequently occurring between a plurality of sensors disposed to be proximate to each other.

As described above, a touch sensing module, according to an example, and an electronic device including the touch sensing module may more clearly distinguish touch inputs acting on a sensor in a proximate position.

In addition, an electronic device including a plurality of touch switches, according to an example, may reduce a frequency of malfunctions between different touch switches.

While specific examples have been illustrated and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing module, comprising:
    a first sensing coil and a second sensing coil, each having inductance varying in response to an applied force touch;
    a first pad having capacitance varying in response to an applied contact touch, disposed closer to the second sensing coil than to the first sensing coil, and electrically connected to the first sensing coil to constitute a first resonance circuit; and
    a second pad having capacitance varying in response to the applied contact touch, disposed closer to the first sensing coil than to the second sensing coil, and electrically connected to the second sensing coil to constitute a second resonance circuit.

2. The touch sensing module of claim 1, wherein the first resonance circuit is configured to generate a first resonance signal having a first resonant frequency varying in response to an applied touch including either one or both of the applied force touch and the applied contact touch, and
    wherein the second resonance circuit is configured to generate a second resonance signal having a second resonant frequency varying in response to the applied touch including either one or both of the applied force touch and the applied contact touch.

3. The touch sensing module of claim 2, further comprising:
    a detection circuit electrically connected to the first and second resonance circuits and configured to determine a touch application position based on a change in the first resonant frequency and a change in the second resonant frequency.

4. The touch sensing module of claim 3, wherein the detection circuit is further configured to:
compare an amount of the change in the first resonant frequency with an amount of the change in the second resonant frequency;
determine that the applied touch is applied to the first resonance circuit, in response to the change in the first resonant frequency being greater than the change in the second resonant frequency; and
determine that the applied touch is applied to the second resonance circuit, in response to the change in the second resonant frequency being greater than the change in the first resonant frequency.

5. The touch sensing module of claim 2, wherein the first resonance circuit is further configured to generate the first resonance signal based on a result of summing a change in the first resonant frequency depending on a change in the inductance of the first sensing coil and a change in the first resonant frequency depending on a change in the capacitance of the first pad, and
wherein the second resonance circuit is further configured to generate the second resonance signal based on a result of summing a change in the second resonant frequency depending on a change in the inductance of the second sensing coil and a change in the second resonant frequency depending on a change in the capacitance of the second pad.

6. The touch sensing module of claim 1, wherein the first and second sensing coils are spaced apart from each other, and
wherein the second pad and the first pad are symmetrically disposed outside the first sensing coil and the second sensing coil, respectively.

7. The touch sensing module of claim 6, further comprising:
a third sensing coil having inductance varying in response to the applied force touch, the third sensing coil being spaced apart from the second sensing coil to be symmetrical with respect to the first sensing coil about the second sensing coil;
a third pad having capacitance varying in response to the applied contact touch, the third pad being disposed closer to the second sensing coil than to the first and third sensing coils, and being electrically connected to the third sensing coil to constitute a third resonance circuit; and
an additional second pad having capacitance varying in response to the applied contact touch, the additional second pad being disposed closer to the third sensing coil than to the first and second sensing coils, and being electrically connected to the second sensing coil.

8. The touch sensing module of claim 6, further comprising:
at least one sensing coil disposed between the first and second sensing coils.

9. An electronic device, comprising:
a touch switch unit disposed on a housing; and
a touch sensing module configured to sense a touch input applied to the touch switch unit,
wherein the touch switch unit comprises a first touch member and a second touch member, and
wherein the touch sensing module comprises:

a first sensing coil and a second sensing coil, each having inductance varying in response to an applied force touch;
a first pad having capacitance varying in response to an applied contact touch, the first pad being disposed closer to the second sensing coil than to the first sensing coil, and the first pad being electrically connected to the first sensing coil to constitute a first resonance circuit; and
a second pad having capacitance varying in response to the applied contact touch, the second pad being disposed closer to the first sensing coil than to the second sensing coil, and the second pad being electrically connected to the second sensing coil to constitute a second resonance circuit.

10. The electronic device of claim 9, wherein the first sensing coil and the first pad are configured to generate a first resonance signal having a first resonant frequency varying in response to an applied touch including either one or both of the applied force touch and the applied contact touch being applied to the touch switch unit, and the second sensing coil and the second pad are configured to generate a second resonance signal having a second resonant frequency varying in response to the applied touch including either one or both of the applied force touch and the applied contact touch being applied to the touch switch unit.

11. The electronic device of claim 10, wherein the touch sensing module is configured to determine a touch application position in the touch switch unit, based on a change in the first resonant frequency and a change in the second resonant frequency.

12. The electronic device of claim 10, wherein the first resonance signal is generated based on a result of summing a change in the first resonant frequency depending on a change in the inductance of the first sensing coil and a change in the first resonant frequency depending on a change in the capacitance of the first pad, and
wherein the second resonance signal is generated based on a result of summing a change in the second resonant frequency depending on a change in the inductance of the second sensing coil and a change in the second resonant frequency depending on a change in the capacitance of the second pad.

13. The electronic device of claim 12, wherein an amount of the change in the first resonant frequency an amount of the change in the second resonant frequency are compared with each other to determine that the applied force touch is applied to the first touch member, in response to the amount of the change in the first resonant frequency being is greater than the amount of the change in the second resonant frequency, and to determine that the applied force touch is applied to the second touch member, in response to the amount of the change in the second resonant frequency being greater than the amount of the change in the first resonant frequency.

14. The electronic device of claim 9, wherein the first and second sensing coils are spaced apart from each other, and
wherein the second pad and the first pad are symmetrically disposed outside the first sensing coil and the second sensing coil, respectively.

15. The electronic device of claim 9, wherein the touch switch unit further comprises a third touch member, and
wherein the touch sensing module further comprises:
a third sensing coil having inductance varying in response to the applied force touch, the third sensing coil being disposed on an inner-side portion spaced apart from the third touch member;

a third pad having capacitance varying in response to the applied contact touch, the third pad being disposed on the inner-side portion spaced apart from the second touch member, and the third pad being electrically connected to the third sensing coil to constitute a third resonance circuit; and an additional second pad having capacitance varying in response to the applied contact touch, the additional second pad being disposed on the inner-side portion spaced apart from the third touch member, and being electrically connected to the second sensing coil.

16. The electronic device of claim 15, wherein the first sensing coil and the second pad are disposed in positions facing the first touch member, wherein the third sensing coil and the additional second pad are disposed in positions facing the third touch member, and wherein the second sensing coil, the first pad, and the third pad are disposed in positions facing the second touch member.

17. The electronic device of claim 9, further comprising:
at least one sensing coil disposed between the first and second sensing coils.

18. The electronic device of claim 9, wherein the first sensing coil and the second pad are disposed in positions facing the first touch member, and wherein the second sensing coil and the first pad are disposed in positions facing the second touch member.

19. An electronic device, comprising:
a touch switch unit disposed on a housing; and
a touch sensing module configured to sense a touch input applied to the touch switch unit,
wherein the touch switch unit comprises a first touch member, a second touch member and a third touch member, and
wherein the touch sensing module comprises:
a first sensing coil, a second sensing coil, and a third sensing coil, each having inductance varying in response to an applied force touch, the first sensing coil and the second sensing coil being respectively disposed on an inner-side portion spaced apart from the first touch member and an inner-side portion spaced apart from the second touch member, and the third sensing coil being disposed on an inner-side portion spaced apart from the third touch member;

a first pad, disposed closer to the second sensing coil than to the first sensing coil, having capacitance varying in response to an applied contact touch, the first pad being disposed on the inner-side portion spaced apart from the second touch member, and the first pad being electrically connected to the first sensing coil to constitute a first resonance circuit;

a second pad, disposed closer to the first sensing coil than to the second sensing coil, having capacitance varying in response to the applied contact touch, the second pad being disposed on the inner-side portion spaced apart from the first touch member, and the second pad being electrically connected to the second sensing coil to constitute a second resonance circuit, and a third pad having capacitance varying in response to the applied contact touch, the third pad being disposed on the inner-side portion spaced apart from the second touch member, and the third pad being electrically connected to the third sensing coil to constitute a third resonance circuit; and an additional second pad having capacitance varying in response to the applied contact touch, the additional second pad being disposed on the inner-side portion spaced apart from the third touch member, and being electrically connected to the second sensing coil.

20. The electronic device of claim 19, wherein the first sensing coil and the second pad are disposed in positions facing the first touch member, wherein the third sensing coil and the additional second pad are disposed in positions facing the third touch member, and wherein the second sensing coil, the first pad, and the third pad are disposed in positions facing the second touch member.

* * * * *